(12) United States Patent
Yajima et al.

(10) Patent No.: US 8,954,305 B2
(45) Date of Patent: Feb. 10, 2015

(54) CIRCUIT SIMULATION APPARATUS AND CIRCUIT SIMULATION METHOD

(75) Inventors: Eiji Yajima, Kawasaki (JP); Shunko Kaneko, Tokyo (JP); Atsushi Asayama, Abiko (JP); Ryo Yamazaki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 813 days.

(21) Appl. No.: 12/818,698

(22) Filed: Jun. 18, 2010

(65) Prior Publication Data

US 2010/0324879 A1 Dec. 23, 2010

(30) Foreign Application Priority Data

Jun. 23, 2009 (JP) ................................ 2009-149068

(51) Int. Cl.
*G06G 7/48* (2006.01)
*G06F 17/50* (2006.01)
*G06G 7/54* (2006.01)

(52) U.S. Cl.
CPC ........ *G06F 17/5036* (2013.01); *G06F 17/5009* (2013.01); *G06F 17/5045* (2013.01); *G06F 17/5068* (2013.01)
USPC ....................... 703/14; 703/4; 703/18; 703/19

(58) Field of Classification Search
CPC ............ G06F 17/5009; G06F 17/5045; G06F 17/5068; G06F 17/5036
USPC .......................................... 703/14, 4, 18, 19
See application file for complete search history.

(56) References Cited

U.S. PATENT DOCUMENTS 7,679,410 B1 *  3/2010  Steinbrecher ............... 327/108
2008/0140379 A1 *  6/2008  Shah et al. ..................... 703/14

FOREIGN PATENT DOCUMENTS

JP          9-319777 A       12/1997

OTHER PUBLICATIONS

Chapter 10, NPL publication, "Lessons in Electric circuits vol. I, Chapter 10", Feb. 7, 2005.*
PSpice, NPL publication "PSpice A/D Manual and Examples", Feb. 2002.*

* cited by examiner

*Primary Examiner* — Omar Fernandez Rivas
*Assistant Examiner* — Angel Calle
(74) *Attorney, Agent, or Firm* — Canon USA Inc. IP Division

(57) ABSTRACT

A circuit simulation apparatus acquires wiring connection information indicating connection data in an electric circuit, selects a component constituting the circuit based on the wiring connection information, performs a setting of replacing the selected component with each resistor having different resistance values, generates at least one of netlists using the acquired wiring connection information and at least one of the set resistance values, calculates a value of an equivalent power source and a value of an internal resistance thereof for a part of the circuit using the acquired wiring connection information and at least one of the generated netlists, and calculates a resistance value of the selected component and a power consumption for the resistance value using the value of the equivalent power source and the value of the internal resistance.

9 Claims, 19 Drawing Sheets

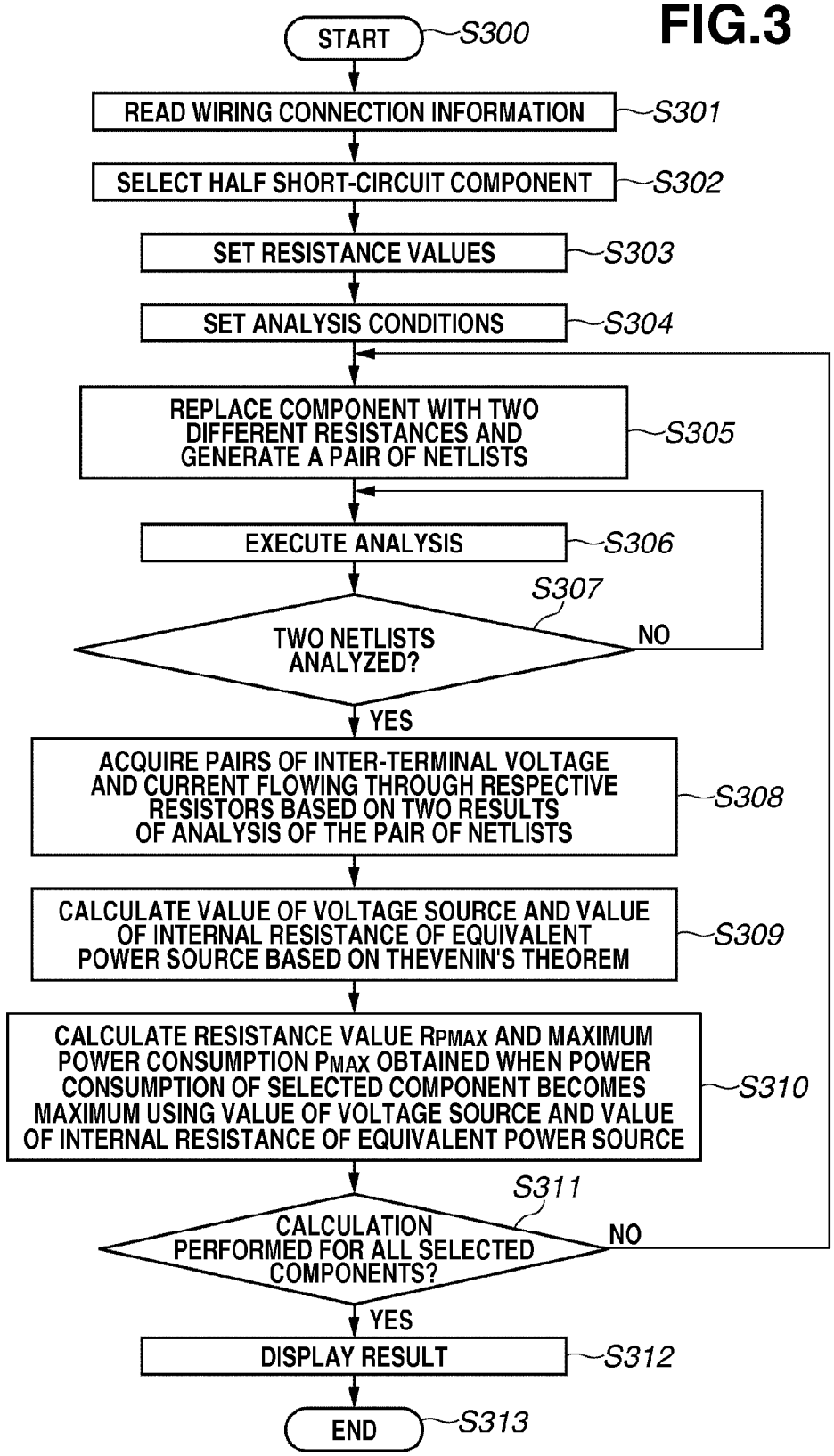

FIG.4A

HALF SHORT-CIRCUIT COMPONENT SELECTION SCREEN

| COMPONENT | HALF SHORT-CIRCUIT |
|---|---|
| R51 | ☐ |
| R52 | ☐ |
| R53 | ☐ |
| R54 | ☑ |
| C51 | ☐ |

FIG.4B

RESISTANCE REPLACEMENT SETTING SCREEN

RESISTANCE 1 USED IN CALCULATION: _____ Ω

RESISTANCE 2 USED IN CALCULATION: _____ Ω

FIG.4C

ANALYSIS CONDITION SETTING SCREEN

ANALYSIS TIME: _____

ANALYSIS STEP WIDTH: _____

FIG.6

| | HALF SHORT-CIRCUIT RESISTANCE DISPLAY SCREEN | |
|---|---|---|
| COMPONENT | HALF SHORT-CIRCUIT RESISTANCE | MAXIMUM POWER CONSUMPTION |
| R54 | 20Ω | 100W |

FIG.8

| V111 | N111 | N114 | 100V |
| R111 | N111 | N114 | 100Ω |
| R112 | N111 | N112 | 100Ω |
| R113 | N112 | N113 | 100Ω |
| R114 | N113 | N114 | 100Ω |
| C111 | N112 | N114 | 100μF |

FIG.9A

| V111 | N111 | N114 | 100V |
|------|------|------|------|
| R111 | N111 | N114 | 100Ω |
| R112 | N111 | N112 | 100Ω |
| R113 | N112 | N113 | 100Ω |
| R131 | N113 | N114 | 1Ω |
| C111 | N112 | N114 | 100μF |

FIG.9B

| V111 | N111 | N114 | 100V |
|------|------|------|------|
| R111 | N111 | N114 | 100Ω |
| R112 | N111 | N112 | 100Ω |
| R113 | N112 | N113 | 100Ω |
| R132 | N113 | N114 | 100kΩ |
| C111 | N112 | N114 | 100μF |

FIG.12

| | | | |
|---|---|---|---|
| V111 | N111 | N114 | 100V |
| R111 | N111 | N114 | 100Ω |
| R112 | N111 | N111 | 100Ω |
| R113 | N111 | N113 | 100Ω |
| R114 | N113 | N114 | 100Ω |
| C111 | N111 | N114 | 100μF |

FIG.13A

| V111 | N111 | N114 | 100V |
|------|------|------|------|
| R111 | N111 | N114 | 100Ω |
| R112 | N111 | N112 | 100Ω |
| R113 | N111 | N113 | 100Ω |
| R191 | N113 | N114 | 1Ω |
| C111 | N111 | N114 | 100μF |

FIG.13B

| V111 | N111 | N114 | 100V |
|------|------|------|------|
| R111 | N111 | N114 | 100Ω |
| R112 | N111 | N112 | 100Ω |
| R113 | N111 | N113 | 100Ω |
| R192 | N113 | N114 | 100kΩ |
| C111 | N111 | N114 | 100μF |

FIG.18

| V261 | N261 | N265 |  | 100V |
|---|---|---|---|---|
| R261 | N261 | N262 |  | 100Ω |
| R262 | N262 | N265 |  | 100Ω |
| R263 | N261 | N263 |  | 100Ω |
| R264 | N264 | N265 |  | 100Ω |
| TR261 | N262 | N263 | N264 | TR |

FIG.19A

| V261 | N261 | N265 | 100V |
|------|------|------|------|
| R261 | N261 | N262 | 100Ω |
| R262 | N262 | N265 | 100Ω |
| R263 | N261 | N263 | 100Ω |
| R264 | N264 | N265 | 100Ω |
| R281 | N262 | N263 | 1Ω |

FIG.19B

| V261 | N261 | N265 | 100V |
|------|------|------|------|
| R261 | N261 | N262 | 100Ω |
| R262 | N262 | N265 | 100Ω |
| R263 | N261 | N263 | 100Ω |
| R264 | N264 | N265 | 100Ω |
| R282 | N262 | N263 | 100kΩ |

CIRCUIT SIMULATION APPARATUS AND CIRCUIT SIMULATION METHOD

BACKGROUND OF THE INVENTION

1. Field of the Invention

The present invention relates to simulation for analyzing electric circuit behavior in an electric circuit.

2. Description of the Related Art

Various evaluations and tests are performed during a test production of an electric circuit to be mounted on an electronic apparatus. An example of such an evaluation is to verify the safety of the electric circuit. This testing is to verify whether safety can be guaranteed even when a component mounted on the electric circuit fails. Specifically, this testing verifies whether an abnormality will occur in another component when the component short-circuits or open-circuits.

This testing has to verify the behavior of the circuit by pseudo-causing the components to fail one by one. Since an operation for setting this pseudo-failed state has to be performed for all of the components constituting the electric circuit, this takes a lot of time. Further, the testing can be wrongly performed due to setting mistakes or lapses. Therefore, a failure analysis method based on circuit simulation has been proposed.

Japanese Patent Application Laid-Open No. 9-319777 discusses an electric circuit failure analysis method which, when a constituent element of an electric circuit has short-circuited or open-circuited, can analyze whether an abnormality will occur in other constituent elements of the electric circuit. More specifically, this method generates a net list of the constituent elements in the electric circuit which have short-circuited or open-circuited, and analyzes the net list. Then, the method compares the analysis result of each constituent element and a prescribed value for each constituent element, and determines whether an abnormality will occur if the analysis result exceeds the prescribed information. The test location and the constituent elements for which it was determined that an abnormality would occur are displayed by flashing. Consequently, just by inputting the circuit information, a user can automatically perform the test, thereby reducing the actual time required for testing. Further, since all settings are automatically tested by an information arithmetic processing apparatus, the testing can be performed more accurately and without lapses as compared with when performed by hand.

Thus, in the electric circuit failure analysis method discussed in Japanese Patent Application Laid-Open No. 9-319777, when a component, which is a constituent element of the electric circuit, has short-circuited or open-circuited, the method analyzes whether an abnormality will occur in the other components. However, component failure is not only due to short-circuiting or open-circuiting. Component failure can also be caused by a component failing while retaining a certain resistance (hereinafter, "half short-circuit"). In such a case, since the abnormality occurs in the failed component itself due to power consumption, testing also needs to be performed for cases in which a half short-circuit has occurred.

However, since the resistance value when a component has half short-circuited varies depending on how the component failed, the power consumption cannot be calculated. Therefore, the testing has to be performed by pseudo-half short-circuiting the component by changing the resistance value of the component to be half short-circuited to a different resistance several times. Consequently, the resistance setting operation takes a very long time. Further, the determination of the resistance values relies on the tester, so that determination mistakes and testing lapses can occur.

To resolve the above-described problems, the resistance during a half short-circuit needs to be calculated. The resistance when a half short-circuit occurs is not a resistance which reproduces the variance caused by how the component failed, but has to be a resistance which includes such variances. This is because calculating a resistance which reproduces a given failed state does not mean that verification could be performed which includes all the individual differences used in mass production. It must be verified that an abnormality state will not occur for all failed states. Further, the reason why an abnormality occurs in a half short-circuited component is that current flows to a failed resistor, thereby causing abnormal heat generation due to power being consumed.

Therefore, to resolve the above-described problems, it is necessary to calculate the resistance value and the power consumption of a component when that component has half short-circuited.

SUMMARY OF THE INVENTION

The present invention is directed to a circuit simulation which can verify whether safety can be guaranteed even when a component constituting an electric circuit fails.

According to an aspect of the present invention, a circuit simulation apparatus includes an acquisition unit configured to acquire wiring connection information indicating connection data in an electric circuit, a component selection unit configured to select a component constituting the circuit based on the wiring connection information, a setting unit configured to perform a setting of replacing the selected component with each resistor having different resistance values, a netlist generation unit configured to generate at least one of netlists using the acquired wiring connection information and at least one of the set resistance values, a first calculation unit configured to calculate a value of an equivalent power source and a value of an internal resistance thereof for a part of the circuit using the acquired wiring connection information and at least one of the generated netlists, and a second calculation unit configured to calculate a resistance value of the selected component and a power consumption for the resistance value using the value of the equivalent power source and the value of the internal resistance.

According to another aspect of the present invention, a circuit simulation method includes acquiring wiring connection information indicating connection data in an electric circuit, selecting a component constituting the circuit based on the wiring connection information, performing a setting of replacing the selected component with each resistor having different resistance values, generating at least one of netlists using the acquired wiring connection information and at least one of the set resistance values, calculating a value of an equivalent power source and a value of an internal resistance thereof for a part of the circuit using the acquired wiring connection information and at least one of the generated netlists, and calculating a resistance value of the selected component and a power consumption for the resistance value using the value of the equivalent power source and the value of the internal resistance.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 3 is a flowchart of the circuit simulation according to the first exemplary embodiment.

FIGS. 4A to 4C illustrate user interface screens according to the first exemplary embodiment.

FIG. 6 illustrates a result display screen according to the first exemplary embodiment.

FIG. 8 is a schematic diagram illustrating wiring connection information about the electric circuit according to the first exemplary embodiment.

FIGS. 9A and 9B illustrate netlists generated in step S305 of FIG. 3 according to the first exemplary embodiment.

FIG. 12 is a schematic diagram illustrating wiring connection information which includes a component which failed due to short-circuiting according to the first exemplary embodiment.

FIGS. 13A and 13B illustrate netlists generated from wiring connection information which includes a component which failed due to short-circuiting, which is generated in step S305 according to the first exemplary embodiment.

FIG. 18 is a schematic diagram illustrating wiring connection information about the electric circuit according to the third exemplary embodiment.

FIGS. 19A and 19B illustrate netlists generated in step S2402 according to the third exemplary embodiment.

DESCRIPTION OF THE EMBODIMENTS

Various exemplary embodiments, features, and aspects of the invention will be described in detail below with reference to the drawings.

Figure 1:
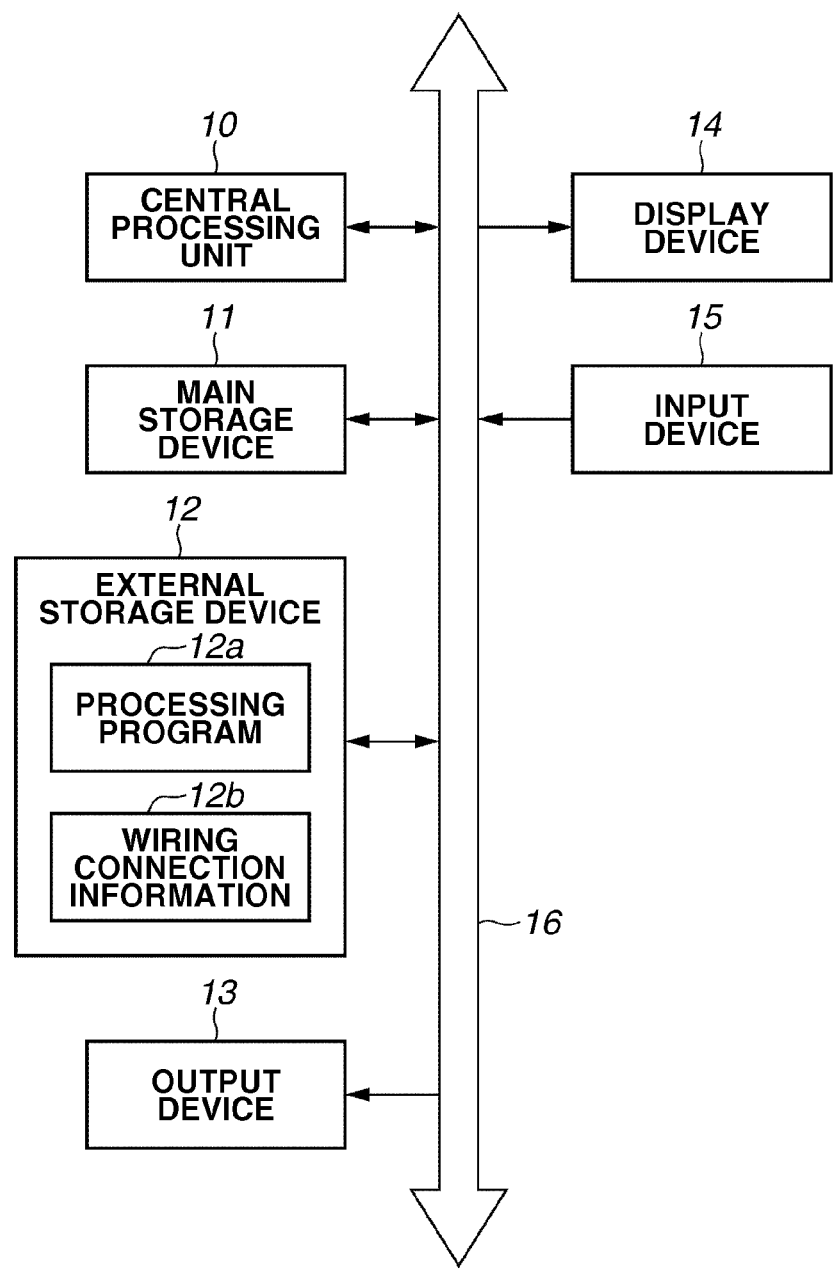
FIG. 1 is a configuration diagram of circuit simulation according to a first exemplary embodiment of the present invention.

FIG. 1 illustrates a configuration of a computer apparatus for executing a circuit simulation method according to a first exemplary embodiment of the present invention. In FIG. 1, a central processing unit (CPU) 10 controls the computer apparatus. A main storage device 11 includes a read-only memory (ROM) and a random access memory (RAM), in which the CPU 10 performs temporary reading and writing during calculation processing. An external storage device 12 is used for the reading and writing of data into a storage medium such as a hard disk, a floppy disk, a compact disc (CD), a digital versatile disc (DVD), a mini disc (MD), and/or the like. An output device (printer) 13 prints a calculation result and the like. Representative examples of a display device 14 include a cathode ray tube and a liquid crystal display. An input device 15 is a device represented by a mouse, a keyboard, and the like. A bus 16 transmits information about an address bus, a data bus, a control bus, and the like. A processing program 12a is a program for performing a circuit simulation installed in the computer apparatus. Wiring connection information 12b is wiring connection information about an electric circuit. This wiring connection information is information about the components constituting a circuit, information about the component terminals, and information about the wiring connection among the component terminals. The CPU 10, main storage device 11, external storage device 12, output device 13, display device 14, and input device 15 are connected to each other via a bus 16.

Figure 2:
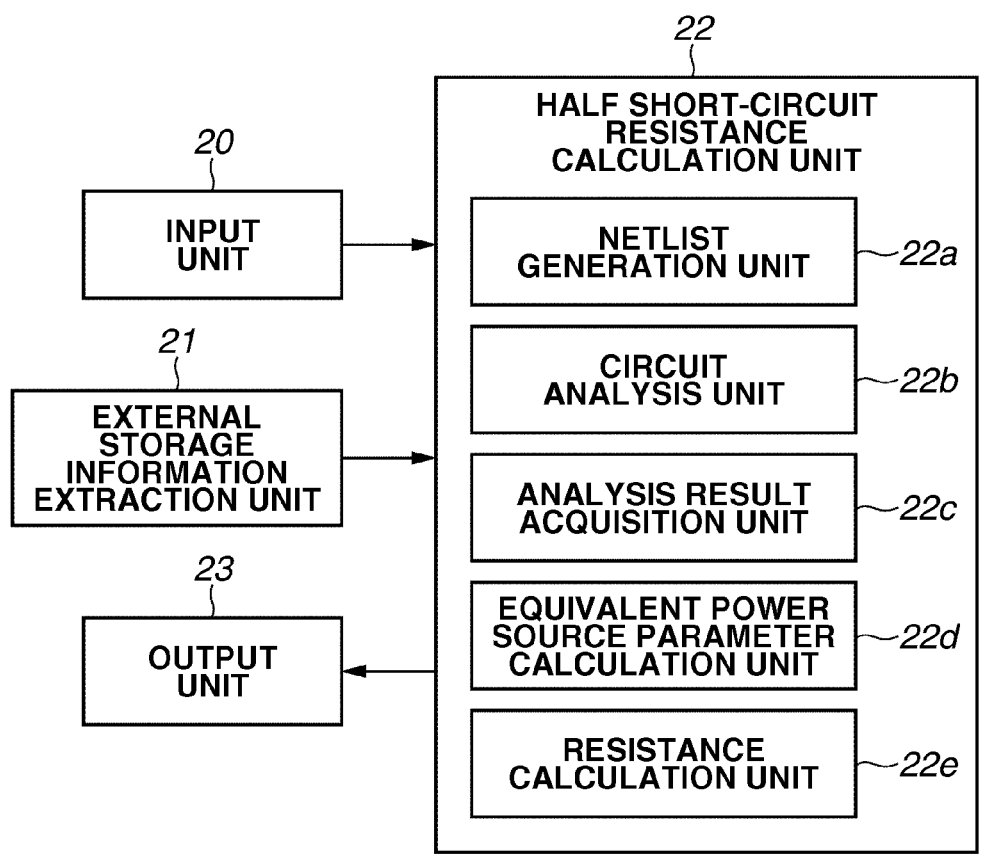
FIG. 2 is a function configuration diagram of the circuit simulation according to the first exemplary embodiment.

FIG. 2 is a function configuration diagram illustrating a configuration of the functions of the circuit simulation program according to the present exemplary embodiment. In FIG. 2, an input unit 20 includes the input device 15. The input unit 20 is a function part for inputting into the computer apparatus a read instruction of wiring connection information 12b, and information about a condition (hereinafter, "analysis condition") to be used in the execution of a processing program 12a and the like. These inputs are input by the user using the input device 15.

An external storage information extraction unit 21 includes the external storage device 12. When an input to execute the processing program 12a is input from the input unit 20, based on that input, the external storage information extraction unit 21 extracts the processing program 12a stored in the external storage device 12 based on a control command from the CPU 10. The extracted processing program 12a is stored in the main storage device 11. Further, when an instruction to read the wiring connection information 12b is output from the input unit 20, based on that instruction, the external storage information extraction unit 21 extracts the wiring connection information 12b stored in the external storage device 12 based on a control command from the CPU 10. The extracted wiring connection information 12b is stored in the main storage device 11.

A half short-circuit resistance calculation unit 22 includes the CPU 10 and the processing program 12a. When the processing program 12a is executed from the input unit 20, the CPU 10 performs processing such as circuit analysis and calculation of a resistance value of a half short-circuited component, while using a partial area of the main storage device 11. This term "half short-circuit" refers to a state in which a component fails while still retaining a certain resistance. The processing by the half short-circuit resistance calculation unit 22 is performed based on the analysis condition, the processing program 12a, and the wiring connection information 12b, which are stored in the main storage device 11.

A netlist generation unit 22a specifies a constituent component based on the wiring connection information 12b extracted by the external storage information extraction unit 21. The netlist generation unit 22a also displays a half short-circuit target component on the display device 14 by an output unit 23. The user selects the component to be half short-circuited from among the displayed components, and inputs a selection via the input device 15. Based on control by the CPU 10, the netlist generation unit 22a generates a netlist in which the component selected by the user is replaced with a different resistance value based on component information input from the input unit 20. The generated netlist is stored in the main storage device 11. Further, the netlist generation unit 22a generates analysis information using the analysis condition input by the user via the input unit 20. The analysis information is stored in the external storage device 12.

Based on control by the CPU 10, a circuit analysis unit 22b performs analysis using the analysis information stored in the external storage device 12. Each analysis result is stored in the external storage device 12. An analysis result acquisition unit 22c extracts the analysis results stored in the external storage device 12 with the external storage information extraction unit 21. Each of the extracted analysis results is stored in the main storage device 11. Further, based on control by the CPU 10, the analysis result acquisition unit 22c extracts the value of the inter-terminal voltage of the replaced resistor and the value of the current flowing through the resistor based on the analysis results stored in the main storage device 11. The extracted inter-terminal voltage and current values are paired, and this pair is stored in the main storage device 11.

Based on control by the CPU 10, an equivalent power source parameter calculation unit 22d calculates the power source value of an equivalent power source and the value of an internal resistance thereof based on the inter-terminal voltage and terminal current pair stored in the main storage device 11. The calculated power source value and internal resistance value are stored in the main storage device 11. Based on control by the CPU 10, a resistance calculation unit 22e calculates the resistance value of a selected component based on the equivalent power source value and the internal resistance value stored in the main storage device 11. Using this resistance value, the resistance calculation unit 22e calculates power consumption value, and stores the resistance value and the power consumption value in the main storage device 11.

The output unit 23 displays the execution result and/or the like of the processing program 12a on the display device 14. More specifically, the output unit 23 displays the resistance value and the power consumption stored in the main storage device 11 on the display device 14.

FIG. 3 is a flowchart illustrating an example of a processing procedure in a circuit simulation according to the present exemplary embodiment. The operations of the circuit simulation program according to the present exemplary embodiment will be described below in more detail using the flowchart of FIG. 3 and the figures from FIGS. 4A-4C to FIGS. 10A and 10B. To make the figures easier to view, similar components are denoted with the same reference numerals even in different figures.

First, the flowchart of FIG. 3 will be described. When the CPU 10 receives a processing program execution instruction from the input unit 20, the CPU 10 reads the processing program 12a transferred to the main storage device 11 by the external storage information extraction unit 21. Then, in step S300, the CPU 10 starts the processing program 12a.

Then, the external storage information extraction unit 21 transfers the wiring connection information 12b to the main storage device 11. In step S301, the processing program 12a reads the wiring connection information stored in the main storage device 11, and extracts information about the components constituting the electric circuit.

In step S302, the input unit 20 receives half short-circuit component information. For the program according to the present exemplary embodiment, this half short-circuit component information is a component number of the component whose resistance value for when the power consumption becomes a maximum is to be calculated. This setting method may be performed by, for example, the user directly inputting the component number into a setting screen displayed on the display device 14, and the CPU 10 reading the input component number. In such a case, a setting screen like that illustrated in FIG. 4A may be displayed on the display device 14, and the components constituting the electric circuit are displayed on the setting screen, so that the user can select the target component. Further, as another method, the user can write the component numbers in a setting file or the like in advance, and store this setting file in the external storage device 12, so that the CPU 10 reads the setting file via the external storage information extraction unit 21. The processing program 12a stores the received component number in the main storage device 11.

When the component to be half short-circuited is specified in step S302, then in step S303, the resistance values to be used in resistance calculation are set. The set resistance values are stored in the main storage device 11. This setting method may be performed by, for example, the user directly inputting the resistance values into a setting screen displayed on the display device 14, and the CPU 10 reading the input resistance values. In such a case, a setting screen like that illustrated in FIG. 4B may be displayed on the display device 14, so that the user can input the resistance values. Further, as another method, the user can write two resistance values in a setting file or the like in advance, so that the CPU 10 reads this setting file. The resistance values of the replaced resistor maybe arbitrary different values, or maybe two pre-set different resistance values. Neither of these choices has an impact on calculation.

In step S304, the analysis condition to be used when performing circuit analysis is set. In the present exemplary embodiment, since transient analysis is performed, "analysis condition" refers to the analysis time and analysis step width. This setting method may be performed by, for example, the user directly inputting the analysis condition into a setting screen displayed on the display device 14, and the CPU 10 reading the input analysis condition. In such a case, a setting screen like that illustrated in FIG. 4C may be displayed on the display device 14, so that the user can input the analysis condition. Further, as another method, the user can write the analysis condition in a setting file or the like in advance, so that the CPU 10 reads this setting file. The processing program 12a stores the set analysis condition in the main storage device 11.

Next, in step S305, a netlist in which one of the components selected in step S302 based on the wiring connection information is replaced with a resistor having the resistance value set in step S303 is generated. The processing program 12a reads the wiring connection information stored in the main storage device 11 and the component number of the component to be half short-circuited, and based on control by the CPU 10, the applicable component number is searched for from among the wiring connection information. Based on control by the CPU 10, a description relating to the searched component is replaced with the resistances set in step S303, and stored in the main storage device 11. Further, the number of generated netlist is stored in the main storage device 11.

Since in step S303, as an example, two resistance values of the replaced resistor are set, at least two netlists are generated. These two a netlist are formed as a pair. The number of netlists is twice the number of combinations of two terminals which can be obtained from the terminals of the component selected in step S302. For example, for a two-terminal component, there is one combination of two terminals which can be obtained from the two terminals. Since the different resistances set in step S303 are inserted between these terminals, two netlists are generated. Further, analysis information is generated based on the generated netlists and the analysis condition set in step S304. The generated analysis information is stored in the external storage device 12. When the processing returns from step S311, this analysis information is stored in the main storage device 11, and similar processing is performed on the component number which has not yet been processed.

In step S306, each netlists is analyzed based on the analysis information generated in step S305. An example of a method for analyzing the behavior of a circuit is to use a circuit simulator such as Simulation Program with Integrated Circuit Emphasis (SPICE). The analysis result is stored in the external storage device 12. Further, the number of analyzed netlists is stored in the main storage device 11.

In step S307, it is determined whether the two netlists generated in step S305 have been analyzed. The processing program 12a reads the number of netlists stored in the main storage device 11 and the number of analyzed netlists, and compares these two numbers based on control by the CPU 10. If it is determined that the number of generated netlists and the number of analyzed netlists are the same (YES in step S307), the processing proceeds to step S308. However, if it is determined that the number of generated netlist is larger than the number of analyzed netlists (NO in step S307), the processing returns to step S306.

If all of the netlists generated in step S305 have been analyzed, then in step S308, based on the two analysis results of the pair of netlists, the inter-terminal voltage of the resistors replaced in step S305 and the current flowing through the resistors are acquired in pairs. The processing program 12a transfers the two analysis results stored in the external storage device 12 to the main storage device 11, and based on control by the CPU 10, acquires the pairs of the inter-terminal voltage and the current based on the respective analysis results. The acquired inter-terminal voltage and current are formed as pairs, and these pairs are stored in the main storage device 11.

Then, in step S309, the value of the voltage source of an equivalent power source and the value of the internal resistance thereof are calculated based on Thevenin's theorem. Thevenin's theorem is a theorem in which a circuit between two terminals can be replaced with a power source in which an internal resistance is connected to a voltage source, like that illustrated in FIG. 5A.

Figure 5A:
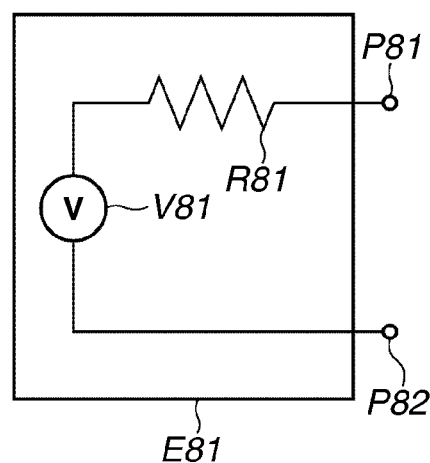
FIGS. 5A and 5B are schematic diagrams relating to a Thevenin equivalent power source.

The circuit illustrated in FIG. 5A includes an equivalent power source E81 which is based on Thevenin's theorem, a voltage source V81 of the equivalent power source E81, an internal resistance R81, and terminals P81 and P82 based on Thevenin's theorem. These two terminals are terminals to which the component to be half short-circuited is connected. By applying Thevenin's theorem to these two terminals, the whole circuit connected to the two terminals, specifically, the whole circuit excluding the selected component, can be replaced with an equivalent power source. If the resistors having different resistance values which are replaced in step S305 are connected to these two terminals, an equivalent circuit like that illustrated in FIG. 5B can be produced.

Figure 5B:
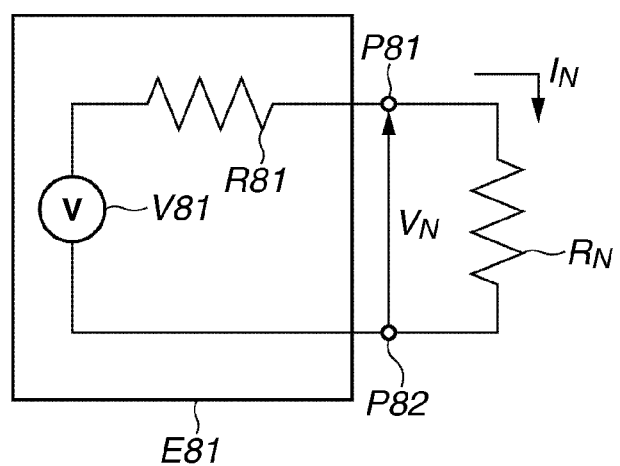

The circuit illustrated in FIG. 5B includes a replaced resistance $R_N$, an inter-terminal voltage $V_N$ of the replaced resistance, and a current $I_N$ flowing through the replaced resistance. In this equivalent circuit, if the two pairs of the inter-terminal voltage and the current acquired in step S308 are applied, the resistance value of the resistor $R_N$ connected to the equivalent power source E81, the inter-terminal voltage $V_N$ of the resistor $R_N$, and the current $I_N$ will be known values. Therefore, two equations will be considered on the condition that the two pairs of the inter-terminal voltage $V_N$ and the current $I_N$ are known values and the voltage value of the voltage source V81 of the equivalent power source E81 and the resistance value of the internal resistance R81 thereof are unknown values. Consequently, since two equations can be produced for the two unknown values, the voltage value of the voltage source V81 of the equivalent power source E81 and the resistance value of the internal resistance R81 thereof, which are unknown values, can be calculated.

The processing program 12a reads the pairs of the inter-terminal voltage and the current stored in the main storage device 11, and based on control by the CPU 10, calculates the voltage value of the voltage source V81 of the equivalent power source E81 and the resistance value of the internal resistance R81 thereof. The calculated voltage value of the voltage source V81 and resistance value of the internal resistance R81 are paired with the component number of the component to be half short-circuited, and are stored in the main storage device 11.

In step S310, using the voltage value of the voltage source V81 of the equivalent power source E81 and the resistance value of the internal resistance R81 stored in the main storage device 11, a resistance value $R_{PMAX}$ obtained when the power supplied to the resistor becomes a maximum in the circuit in which the resistor is connected to the equivalent power source E81 is calculated. The processing program 12a reads the voltage value of the voltage source V81 of the equivalent power source E81 and the resistance value of the internal resistance R81 stored in the main storage device 11, and based on control by the CPU 10, calculates the resistance value obtained when the supplied power becomes a maximum. The calculated resistance value is stored in the main storage device 11. In addition, the processing program 12a reads the resistance value stored in the main storage device 11, and calculates the power consumption when the value of the resistance $R_N$ illustrated in FIG. 5B is $R_N = R_{PMAX}$. This calculated result becomes the maximum power consumption. The component number, the resistance value $R_{PMAX}$, and the maximum power consumption are stored in pairs in the main storage device 11.

In step S311, it is determined whether calculation for all of the components selected in step S302 has finished. If the processing program 12a determines that there is still a component which has not been processed among the components to be half short-circuited stored in the main storage device 11 (NO in step S311), the processing returns to step S305. If the processing program 12a determines that all of the components to be half short-circuited stored in the main storage device 11 have been processed (YES in step S311), the processing proceeds to step S312.

In step S312, the analysis result stored in the main storage device 11 in step S310 is output. An example of this result output method is to read the paired component number, resistance value, and maximum power consumption stored in the main storage device 11, and based on control by the CPU 10, display a result output screen on the display device 14. In such a case, a display screen like that illustrated in FIG. 6 may be displayed on the display device 14.

In step S313, when outputting finishes, the processing program 12a ends.

The above is a detailed description of an example of the flowchart of the circuit simulation according to the first exemplary embodiment.

Figure 7:
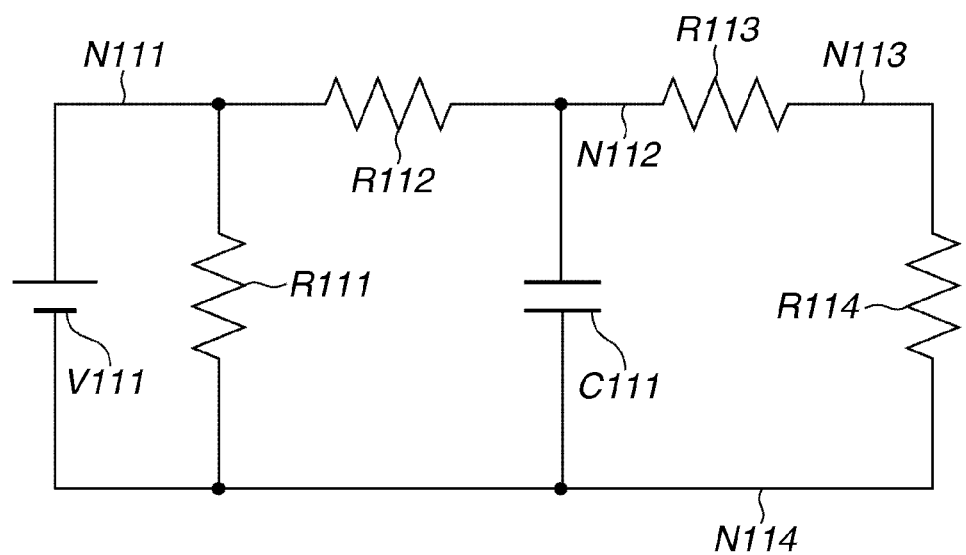
FIG. 7 is a schematic diagram of an electric circuit according to the first exemplary embodiment.

Next, the operations of a circuit simulation program will be described in more detail using the figures from FIG. 7 to FIGS. 10A and 10B. First, the electric circuit diagram and the schematic diagram illustrating wiring connection information illustrated in FIGS. 7 and 8 will be described. FIG. 7 illustrates an electric circuit diagram. The circuit illustrated in FIG. 7 includes resistors R111, R112, R113, and R114, a capacitor C111, net node numbers N111, N112, N113, and N114, and a voltage source V111. Here, all of the resistors have a resistance value of 100 (Ω), the capacitor C111 has a capacitance value of 100 (μF), and the voltage source V111 has a voltage value of 100 (V). FIG. 8 illustrates wiring connection information about the electric circuit diagram illustrated in FIG. 7. The operations of a program when the program according to the present exemplary embodiment is applied to the electric circuit diagram illustrated in FIG. 7 and the wiring connection information illustrated in FIG. 8 will now be described in more detail.

In step S300, the processing program 12a is started. Then, in step S301, the processing program 12a acquires the constituent component information and the wiring connection information described in the wiring connection information 12b. The constituent component information is the component number of the components described in the wiring connection information 12b. In this example, the constituent component information is the resistors R111, R112, R113, and R114, and the capacitor C111. Next, in step S302, the component to be half short-circuited is set (in this example, the resistor R114 will be set as the half short-circuited). Next, in step S303, the resistance values of a resistor with which the resistor R114 is replaced are set (in this example, 1Ω and 100 kΩ). In step S304, the analysis condition is set (in this example, analysis time of 1 second, analysis step width of 1 microsecond). In step S305, netlists in which the resistor R114 is replaced with 1Ω and 100 kΩ are generated. These netlists are illustrated in FIGS. 9A and 9B.

FIG. 9A illustrates a netlist in which the resistor R114 is replaced with 1Ω and FIG. 9B illustrates a netlist in which the resistor R114 is replaced with 100 kΩ. R131 in FIG. 9A and R132 in FIG. 9B indicate the component numbers of the replaced resistors. The description relating to the resistor R131 indicates that the resistor R131 is connected to nets N113 and N114, and that the resistor R131 has a resistance value of 1Ω. The description relating to the resistor R132 indicates that the resistor R132 is connected to nets N113 and N114, and that the resistor R132 has a resistance value of 100 kΩ. In the present exemplary embodiment, two netlists are generated, and these two netlists are formed as a pair. Further, the analysis information is generated using the analysis condition set in step S304 and the netlists generated in step S305. Examples of the analysis information generated at this stage include a command for executing transient analysis, netlists, and the like. Parameters of the command for executing transient analysis may include the analysis time and the analysis step width. In this example, these are respectively set to an analysis time of 1 second and an analysis step width of 1 microsecond. In the present exemplary embodiment, since two netlists are generated, two pieces of analysis information are also generated.

In step S306, using the generated analysis information, circuit analysis is executed. In step S307, it is determined whether analysis of the two netlists has finished. If only the first netlist has been analyzed (NO in step S307), the processing returns to step S306. If the second netlist has been analyzed (YES in step S307), the processing proceeds to step S308. In step S308, the inter-terminal voltage and the current of the resistors R131 and R132 are acquired based on the analysis result of each netlist. If the netlists illustrated in FIGS. 9A and 9B are analyzed, results like those illustrated FIGS. 10A and 10B will be obtained for the inter-terminal voltage and the current of the resistors R131 and R132.

Figure 10A:
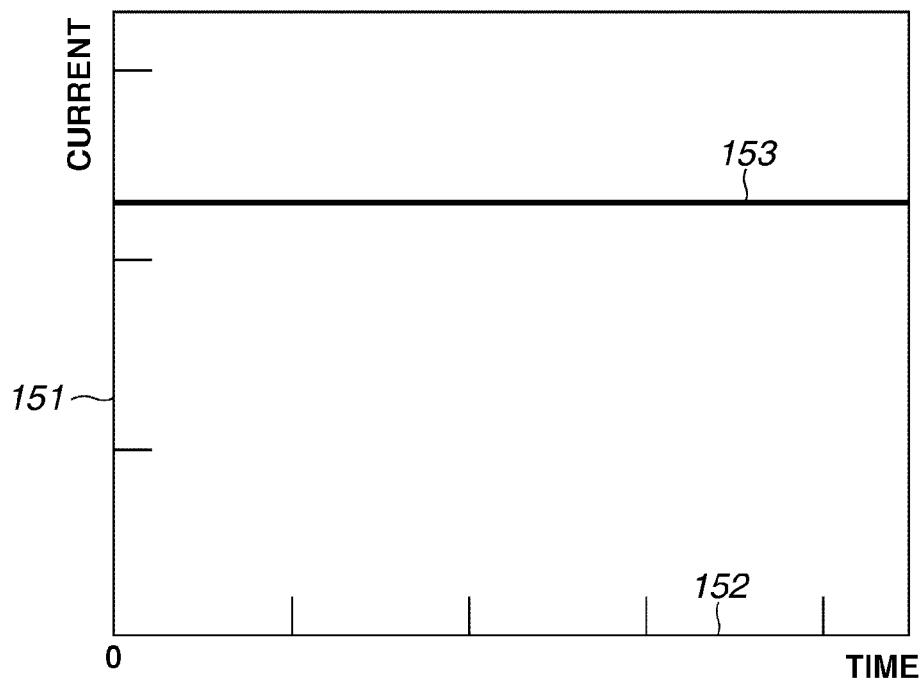
FIGS. 10A and 10B illustrate an analysis result generated in step S306 of FIG. 3 according to the first exemplary embodiment.
Figure 10B:
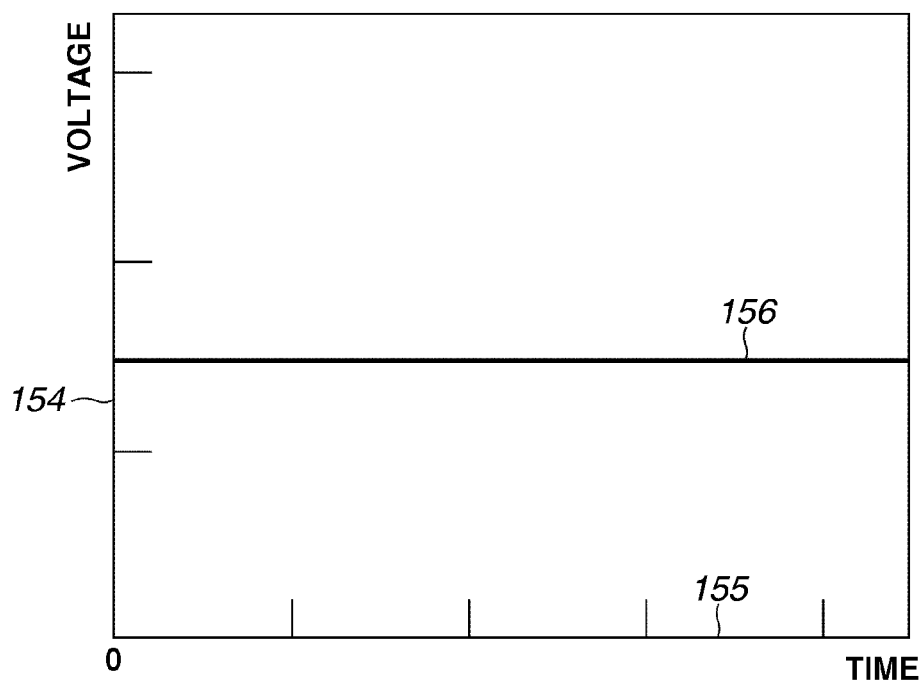

FIGS. 10A and 10B schematically illustrate the analysis results. FIG. 10A schematically illustrates the results of current as a function of time. FIG. 10B schematically illustrates the results of voltage as a function of time. FIG. 10A illustrates a current axis 151, a time axis 152, and a current 153 flowing through the resistor R131. FIG. 10B illustrates a voltage axis 154, a time axis 155, and an inter-terminal voltage 156 of the resistor R131. When the current or the voltage as a function of time varies, such as with alternating current, an effective value like that illustrated in equations (1) and (2) is calculated. Equation (1) is an equation in which the current effective value is calculated. Equation (2) is an equation in which the voltage effective value is calculated. In these equations, I represents the current effective value, V the voltage effective value, T the analysis time, i the current, and v the voltage.

$$I = \sqrt{\frac{1}{T}\int_0^T i^2 dt} \qquad (1)$$

$$V = \sqrt{\frac{1}{T}\int_0^T v^2 dt} \qquad (2)$$

In the present exemplary embodiment, an inter-terminal voltage $V_1$ of the resistor R131 is 498 (mV), a current $I_1$ flowing through the resistor R131 is 498 (mA), an inter-terminal voltage $V_2$ of the resistor R132 is 99.8 (V), and a current $I_2$ flowing through the resistor R132 is 0.998 (mA).

Using these analysis results, in step S309, the voltage value of the equivalent power source E81 and the resistance value of the internal resistance R81 are calculated based on Thevenin's theorem. Here, if Kirchhoff's law is applied to the electric circuit diagram illustrated in FIG. 5B, the voltage value $V_{V81}$ of the voltage source V81 is represented as follows.

$$V_{V81} = \frac{V_2 \cdot I_1 - V_1 \cdot I_2}{I_1 - I_2} \qquad (3)$$

Further, the resistance value R81 of the internal resistance R81 is represented as follows.

$$R81 = \frac{V_2 - V_1}{I_1 - I_2} \qquad (4)$$

If the two pairs of the inter-terminal voltage $V_N$ and the current $I_N$ are substituted into equations (3) and (4), the calculated voltage value $V_{V81}$ of the voltage source V81 is 100 V, and the calculated resistance value R81 of the internal resistance R81 is 200Ω.

In step S310, the resistance value obtained when the power consumption of the resistor R114 selected in step S302 becomes a maximum is calculated. A resistor Rx having a resistance value Rx is connected to the two terminals P81 and P82 of the equivalent power source E81. Here, the value of the resistor Rx is unknown. In this equivalent circuit, the resistance value Rx obtained when a power consumption $P_{Rx}$ of the resistor Rx becomes a maximum is calculated. This result becomes the resistance value $R_{PMAX}$ consuming the maximum power when the resistor R114 has half short-circuited.

Thus, first, the current value $I_{Rx}$ flowing through the resistor Rx is represented as follows.

$$I_{Rx} = \frac{V_{V81}}{R81 + Rx} \qquad (5)$$

Further, the inter-terminal voltage $V_{Rx}$ of the resistor Rx is represented as follows.

$$V_{Rx} = \frac{Rx}{R81 + Rx} \cdot V_{V81} \qquad (6)$$

Since the power consumption $P_{Rx}$ of the resistor Rx is the product of equations (5) and (6), it is represented as follows.

$$P_{Rx} = \frac{Rx}{(R81 + Rx)^2} \cdot V_{V81}^2 \qquad (7)$$

It can thus be seen that the power consumption $P_{Rx}$ of the resistor Rx is a function of the resistance value Rx of the resistor Rx. Therefore, equation (8) can be obtained by differentiating equation (7) by the resistance value Rx of the resistor Rx.

$$\frac{dP_{Rx}}{dRx} = \frac{V_{V81}^2 \cdot (R81 + Rx)}{(R81 + Rx)^4} \cdot (R81 - Rx) \qquad (8)$$

In equation (8), since the voltage and the resistance values are positive, the differential coefficient when R81>Rx is positive, the differential coefficient when R81=Rx is zero, and the differential coefficient when R81<Rx is negative. Therefore, it can be seen that when the resistance Rx is the same as the resistance value R81 of the internal resistance R81 of the equivalent power source E81, the power consumption $P_{Rx}$ becomes a maximum. Based on this calculation, when the resistor R114 is half short-circuited, the resistance value $R_{PMAX}$ obtained when the power supplied to the resistor R114 itself becomes a maximum is 200Ω. The power consumption $P_{MAX}$ at that point is 12.5 W.

In step S311, if the calculation for all of the selected components has finished (YES in step S311), the processing proceeds to step S312. If the calculation has not finished (NO in step S311), the processing returns to step S305. In the present exemplary embodiment, since the selected component is only the resistor R114, the processing proceeds to step S312, and the result is output on the screen illustrated in FIG. 6. In the present exemplary embodiment, the values output on the screen illustrated in FIG. 6 are R114 in the component column, 200Ω in the half short-circuit resistance column, and 12.5 W in the maximum power consumption column. When step S312 finishes, the processing proceeds to step S313. In step S313, based on control by the CPU 10, the processing program 12a ends.

The above is a description of the operations of a circuit simulation program according to the present exemplary embodiment. Based on the results displayed on the screen illustrated in FIG. 6, the user determines whether the resistor R114 is a component which can withstand the maximum power consumption when a half short-circuit occurs. Based on that determination, if it is determined that the resistor R114 is a component which cannot withstand a half short-circuit, for example, the user can take a measure such as changing the resistor R114 component to a component having a greater rated power consumption. The user could also take a measure such as modifying the electric circuit so that the power consumption does not increase even when the resistor R114 half short-circuits.

Further, in the present exemplary embodiment, as the method for outputting the calculation results, only displaying a display format on a screen using the display device 14 has been described. However, the present exemplary embodiment may include other display methods. For example, a file describing the component number, maximum power consumption when a half short-circuit occurs, and the resistance value at that stage in a text format may be output. In such a case, in step S312, for example, by outputting the file described in a text format to the external storage device 12, the user can confirm the calculation results even after the processing program 12a has ended.

Further, in the present exemplary embodiment, although the calculations are performed using the equations represented by equations (1) to (8), other equations may also be used.

Further, in the present exemplary embodiment, an example has been described in which the maximum power consumption when a half short-circuit occurs and the resistance value at that point are calculated based on normal wiring connection information like that illustrated in FIG. 8. On the other hand, calculating the maximum power consumption when a half short-circuit occurs and the resistance value at that point based on wiring connection information in which another component is made to fail is also included in the present exemplary embodiment.

Figure 11:
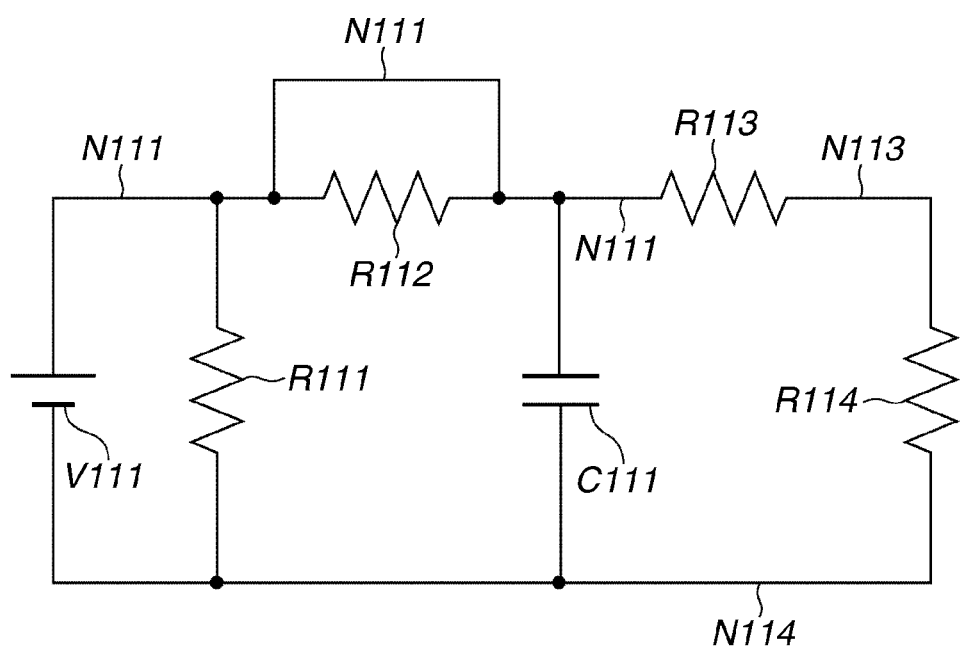
FIG. 11 is a schematic diagram illustrating an electric circuit which includes a component which failed due to short-circuiting according to the first exemplary embodiment.

For example, FIGS. 11 and 12 illustrate a method for calculating the maximum power consumption of the resistor R114 when the resistor R114 has half short-circuited, and the resistance value at that point, based on a state in which the resistor R112 has failed due to a short circuit. FIG. 11 illustrates an electric circuit diagram for when the resistor R112 in FIG. 7 has short circuited. FIG. 12 illustrates wiring connection information for when the resistor R112 in FIG. 8 has short-circuited. In a state in which the resistor R112 has short-circuited and the resistor R114 has half short-circuited, the resistance value when the power consumption of the resistor R114 becomes a maximum, and the power consumption at that point are calculated. In this case, in step S301, the wiring connection information illustrated in FIG. 12 is read, and in step S302, the component to be half short-circuited is selected (in this example, resistor R114 is selected). Further, in step S303, different resistance values are set (in this example, 1Ω and 100 kΩ). In step S304, the analysis condition is set (in this example, analysis time of 1 second, analysis step width of 1 microsecond). In step S305, two netlists in which the resistor R114 is replaced with the resistor having the different resistance values are generated.

The generated netlists are illustrated in FIGS. 13A and 13B. In FIGS. 13A and 13B, "R191" and "R192" represent the component numbers of resistors with which the resistor R114 is replaced. FIG. 13A illustrates a netlist in which the resistor R114 is replaced with the 1Ω resistor R191. FIG. 13B illustrates a netlist in which the resistor R114 is replaced with the 100 kΩ resistor R192.

The processing of steps S306 and S307 is similar to that described in the present exemplary embodiment, and thus a description thereof will be omitted. In step S308, the inter-terminal voltage and the current of the replaced resistors are acquired. The inter-terminal voltage $V_1$ of the resistor R191 is 0.990 (V), the current $I_1$ flowing through the resistor R191 is 0.990 (A), the inter-terminal voltage $V_2$ of the resistor R192 is 99.9 (V), and the current $I_2$ flowing through the resistor R192 is 0.999 (mA). Using these analysis results, in step S309, the voltage value of the voltage source V81 of the equivalent power source E81 and the resistance value of the internal resistance R81 are calculated based on Thevenin's theorem.

Based on a calculation using equations (3) and (4), the voltage value of the voltage source V81 is 100 (V) and the resistance value of the internal resistance R81 is 100 (Ω). In step S310, the resistance value obtained when the power consumption becomes a maximum and the power consumption at that point are calculated. Consequently, when the resistor R114 has half short-circuited, the resistance value obtained when the power consumption of the resistor R114 itself becomes a maximum is 100 (Ω), and the power consumption at that point is 25 (W).

The above description is an example in which the wiring connection information about a state when a component has short-circuited is used in the present exemplary embodiment. However, analysis can similarly be performed using wiring connection information for a state in which the component is open. Further, although in the above example wiring connection information is used for a state in which a single component has short-circuited, similar analysis can be performed even using wiring connection information for a state in which a plurality of components have short-circuited or open-circuited.

In addition, in the present exemplary embodiment, an example has been described in which analysis is performed by generating a netlist in which the component to be half short-circuited is replaced with two different resistances. However, analysis performed by generating a netlist in which the component has been short-circuited or open-circuited is also included in the present exemplary embodiment. For example, such analysis can be performed by omitting step S303 illustrated in FIG. 3, and changing step S305 to a step for generating a pair of netlists in which the component has been short-circuited or open-circuited, and step S308 to a step for acquiring the open circuit voltage and the short circuit current based on the pair of analysis results.

In the first exemplary embodiment, an exemplary embodiment has been described in which the maximum power consumption obtained when a component has half short-circuited and the resistance value at that point are calculated by generating an equivalent power source based on Thevenin's theorem. Consequently, the maximum power which can be consumed when the component has half short-circuited can be clearly indicated to the user. However, the method for generating the equivalent power source is not limited to Thevenin's theorem. The equivalent power source can also be generated using Norton's theorem. Accordingly, in a second exemplary embodiment of the present invention, an exemplary embodiment will be described relating to circuit simulation for calculating the maximum power consumption obtained when a component has half short-circuited and the resistance value at that point by generating an equivalent power source based on Norton's theorem.

The operations of a circuit simulation program according to the present exemplary embodiment will now be described in detail using FIGS. 14A and 14B. Description of similar processing which is performed in FIG. 3 described in the first exemplary embodiment will be omitted. Thus, the processing different to the processing of the first exemplary embodiment, specifically, the processing in the present exemplary embodiment corresponding to steps S309 and S310, will be described in detail.

In the step corresponding to step S309, using the inter-terminal voltage and the current flowing through the resistor acquired in step S308, the value of the current source of the equivalent power source and the resistance value of the internal resistance are calculated based on Norton's theorem. Norton's theorem is a theorem in which a circuit formed between two terminals can be replaced with a power source in which an internal resistance is connected in parallel to a current source, like as illustrated in FIG. 14A.

Figure 14A:
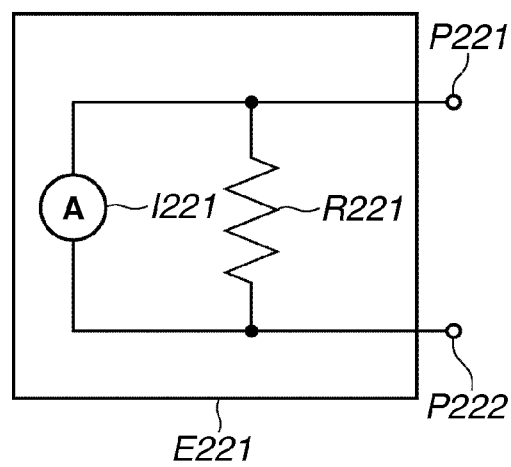
FIGS. 14A and 14B are schematic diagrams relating to a Norton equivalent power source.

The circuit illustrated in FIG. 14A includes an equivalent power source E221, which is based on Norton's theorem, a current source I221 of the equivalent power source E221, an internal resistance R221, and terminals P221 and P222 based on Norton's theorem. These two terminals are terminals to which the component to be half short-circuited is connected. By applying Norton's theorem to these two terminals, the whole circuit connected to the two terminals, specifically, the whole circuit excluding the selected component, can be replaced with an equivalent power source. If the resistance values which are replaced in step S305 are connected to these two terminals, an equivalent circuit like that illustrated in FIG. 14B can be produced.

Figure 14B:
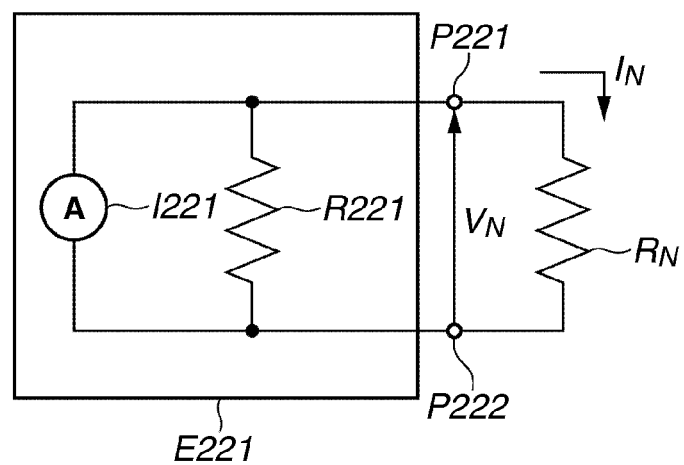

The circuit illustrated in FIG. 14B includes a replaced resistance $R_N$, an inter-terminal voltage $V_N$ of the replaced resistance, and a current $I_N$ flowing through the replaced resistance. In this equivalent circuit, if the two pairs of the inter-terminal voltage and the current acquired in step S308 are applied, the resistance value of the resistance $R_N$ connected to the equivalent power source E221, the inter-terminal voltage $V_N$ of the resistance $R_N$, and the current $I_N$ will be known values. Therefore, two equations will be considered on the condition that the two pairs of the inter-terminal voltage $V_N$ and the current $I_N$ are known values and the current value of the current source I221 of the equivalent power source E221 and the resistance value of the internal resistance R221 are unknown. Consequently, since two equations can be produced for the two unknown values, the current value of the current source I221 of the equivalent power source E221 and the resistance value of the internal resistance R221, which are unknown, can be calculated.

The processing program 12a reads the values of the inter-terminal voltage and the current stored in the main storage device 11, and based on control by the CPU 10, calculates the current value of the current source I221 of the equivalent power source E221 and the resistance value of the internal resistance R221. The calculated current value of the current source I221 and resistance value of the internal resistance R221 are paired and stored in the main storage device 11.

In the step corresponding to step S310, using the current value of the current source I221 of the equivalent power source E221 and the resistance value of the internal resistance R221 determined by the above-described calculation, the resistance value $R_{PMAX}$ obtained when the power supplied to the component selected in step S302 becomes a maximum is calculated. Since the current value of the current source I221 of the equivalent power source E221 and the resistance value of the internal resistance R221 are known, the resistance value obtained when the power supplied to the resistor becomes a maximum in the circuit in which the resistor is connected to the equivalent power source E221 can be calculated. The processing program 12a reads the current value of the current source I221 of the equivalent power source E221 and the resistance value of the internal resistance R221 stored in the main storage device 11, and based on control by the CPU 10, calculates the resistance value obtained when the power consumption of the resistor becomes a maximum. The calculated resistance value is stored in the main storage device 11. The processing program 12a reads the resistance value stored in the main storage device 11, and based on control by the CPU 10, calculates the power consumption at that point. The component number, the resistance value $R_{PMAX}$, and the maximum power consumption are paired and stored in the main storage device 11.

The above is a detailed description of an example of the flowchart of the circuit simulation according to the second exemplary embodiment.

Next, the operations of a program when the program according to the second exemplary embodiment is applied to the electric circuit diagram illustrated in FIG. 7 and the wiring connection information illustrated in FIG. 8 will now be described in more detail. Here, the electric circuit diagram used for the description, a netlist, the component to be half short-circuited, the resistance values of the replaced resistor, and the analysis condition are similar to those in the first exemplary embodiment. The values obtained in step S308 are respectively an inter-terminal voltage $V_1$ of the resistor R131 of 498 (mV), a current $I_1$ flowing through the resistor R131 of 498 (mA), an inter-terminal voltage $V_2$ of the resistor R132 of 99.8 (V), and a current $I_2$ flowing through the resistor R132 of 0.998 (mA). In the step corresponding to step S309, the current value of the current source I221 of the equivalent power source E221 and the resistance value of the internal resistance R221 are calculated based on Norton's theorem.

Here, if Kirchhoff's law is applied to the electric circuit diagram illustrated in FIG. 14B, the resistance value R221 of the resistor R221 is represented as follows.

$$R221 = \frac{V_2 - V_1}{I_1 - I_2} \quad (9)$$

Further, the current value $I_{I221}$ of the current source I221 is represented as follows.

$$I_{I221} = \frac{V_2 \cdot I_1 - V_1 \cdot I_2}{V_2 - V_1} \quad (10)$$

Based on the above calculations, the current value $I_{I221}$ of the current source I221 is 0.500 (A), and the resistance value R221 of the internal resistance R221 is 200 (Ω).

In the step corresponding to step S310, based on the parameters of the equivalent power source E221, the resistance value obtained when the power consumption of the component selected in step S302 becomes a maximum is calculated. Therefore, similar to the first exemplary embodiment, a resistor Rx having an unknown resistance value is connected to the equivalent power source E221, and the resistance value Rx obtained when the power consumption of the resistor Rx becomes a maximum is calculated.

First, the current value $I_{Rx}$ flowing through the resistor Rx is represented as follows.

$$I_{Rx} = \frac{R221}{R221 + Rx} \cdot I_{I221} \quad (11)$$

Further, the inter-terminal voltage $V_{Rx}$ of the resistor Rx is represented as follows.

$$V_{Rx} = \frac{R221}{R221 + Rx} \cdot I_{I221} \cdot Rx \quad (12)$$

Since the power consumption $P_{Rx}$ of the resistor Rx is the product of equations (11) and (12), it is represented as follows.

$$P_{Rx} = \frac{R221^2 \cdot I_{I221}^2}{(R221 + Rx)^2} \cdot Rx \quad (13)$$

If the power consumption $P_{Rx}$ of the resistor Rx is differentiated by the resistance value Rx of the resistor Rx, equation (14) can be obtained.

$$\frac{dP_{Rx}}{dRx} = \frac{(R221 \cdot I_{I221})^2 \cdot (R221 + Rx)}{(R221 + Rx)^4} \cdot (R221 - Rx) \quad (14)$$

The details of equations (11) to (14) are similar to those described for equations (5) to (8) in the first exemplary embodiment, and thus a description thereof will be omitted. Based on equation (14), when the resistance value Rx of the resistor Rx is Rx=R221, the power consumption of the resistor Rx becomes a maximum. Based on this calculation, when the resistor R114 has half short-circuited, the resistance value obtained when the power supplied to the resistor R114 itself becomes a maximum is 200Ω. The supplied power at that point is 12.5 W. In step S311, if the calculation for all of the selected components has finished (YES in step S311), the processing proceeds to step S312. If the calculation has not finished (NO in step S311), the processing returns to step S305. In the present exemplary embodiment, since the selected component is only the resistor R114, the processing proceeds to step S312, and the result is output on the screen illustrated in FIG. 6. When step S312 finishes, the processing proceeds to step S313. In step S313, based on control by the CPU 10, the processing program 12a ends.

The above is a description of the operations of a circuit simulation program according to the second exemplary embodiment. Based on the results displayed on the screen illustrated in FIG. 6, the user determines whether the resistor R114 is a component which can withstand the maximum power consumption when a half short-circuit occurs. Based on that determination, if it is determined that the resistor R114 is a component which cannot withstand a half short-circuit, for example, the user can take a measure such as changing the resistor R114 component to a component having a greater rated power consumption. The user could also take a measure such as modifying the electric circuit so that the power consumption does not increase even when the resistor R114 half short-circuits.

Similar to the first exemplary embodiment, the second exemplary embodiment also includes display methods other than a display on a screen using the display device 14. Further, equations other than equations (9) to (14) used in the present exemplary embodiment may also be used. In addition, similar to the first exemplary embodiment, similar analysis can be performed in the present exemplary embodiment even using wiring connection information for a state in which a single component or a plurality of components have short-circuited or open-circuited. Moreover, analysis performed by generating netlists in which the component has open-circuited or short-circuited is also included in the present exemplary embodiment. For example, such analysis can be performed by omitting step S303 illustrated in FIG. 3, and changing step S305 to a step for generating a pair of netlists in which the component has been short-circuited or open-circuited.

Further, in both the first and second exemplary embodiments, two netlists are generated in which the components selected in step S302 are replaced with two different resistances. On the other hand, calculation can be performed using wiring connection information 12b stored in the external storage device 12 before executing the program as one netlist, and newly generating another netlist in step S305. In this case, the wiring connection information 12b is read and the resistance value of the component to be half short-circuited is acquired. In addition, one netlist in which this resistance value is changed may be generated and stored in the main storage device 11.

In the first and second exemplary embodiments, examples have been described in which a component having two terminals is selected as the component to be half short-circuited. However, similar calculations may also be performed for components having three or more terminals. Accordingly, in a third exemplary embodiment of the present invention, an example will be described relating to circuit simulation for calculating the maximum power consumption obtained when a component having three or more terminals has half short-circuited and the resistance value at that point.

Figure 15:
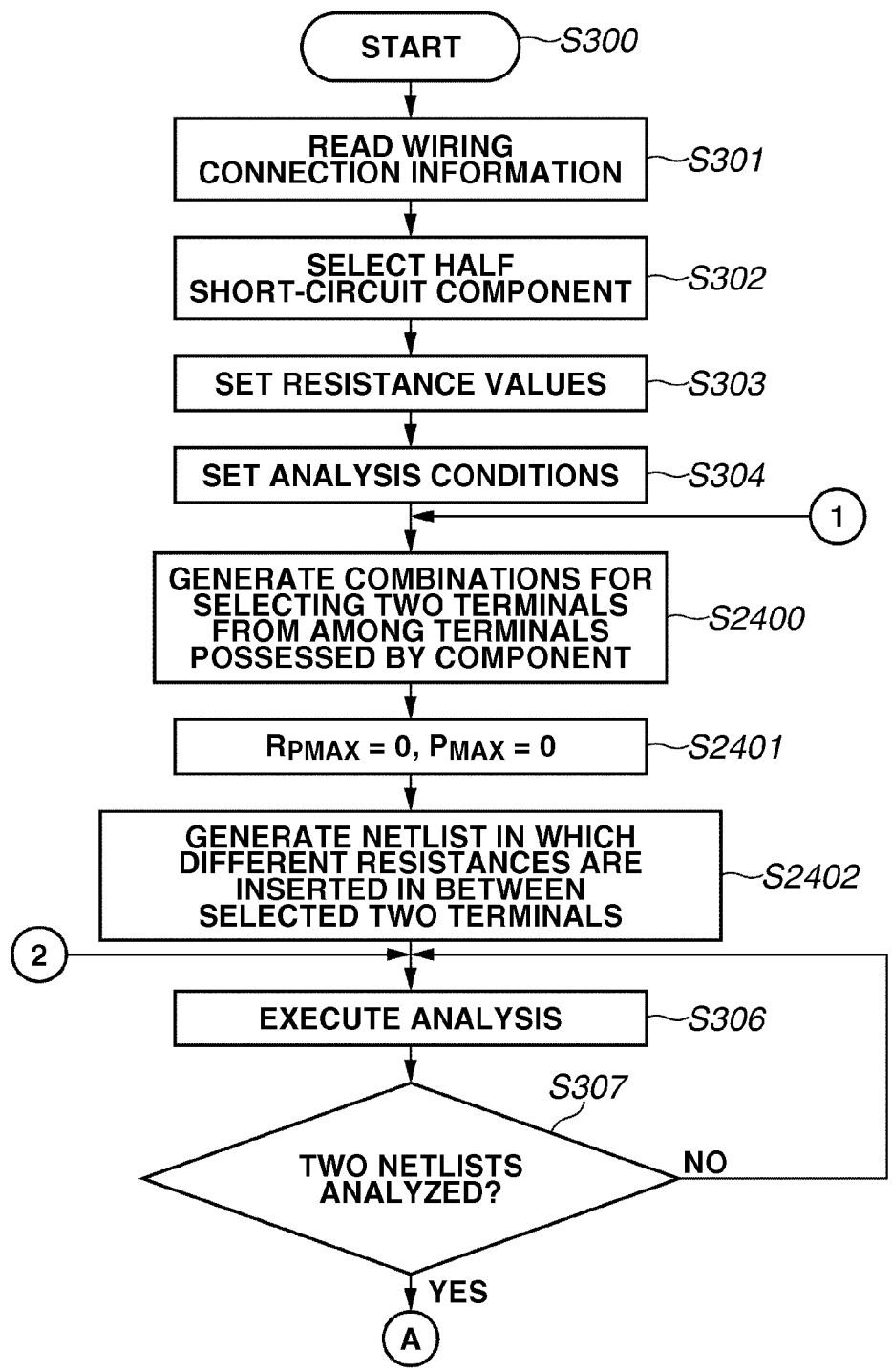
FIG. 15 is a flowchart of the circuit simulation according to a third exemplary embodiment of the present invention.
Figure 16:
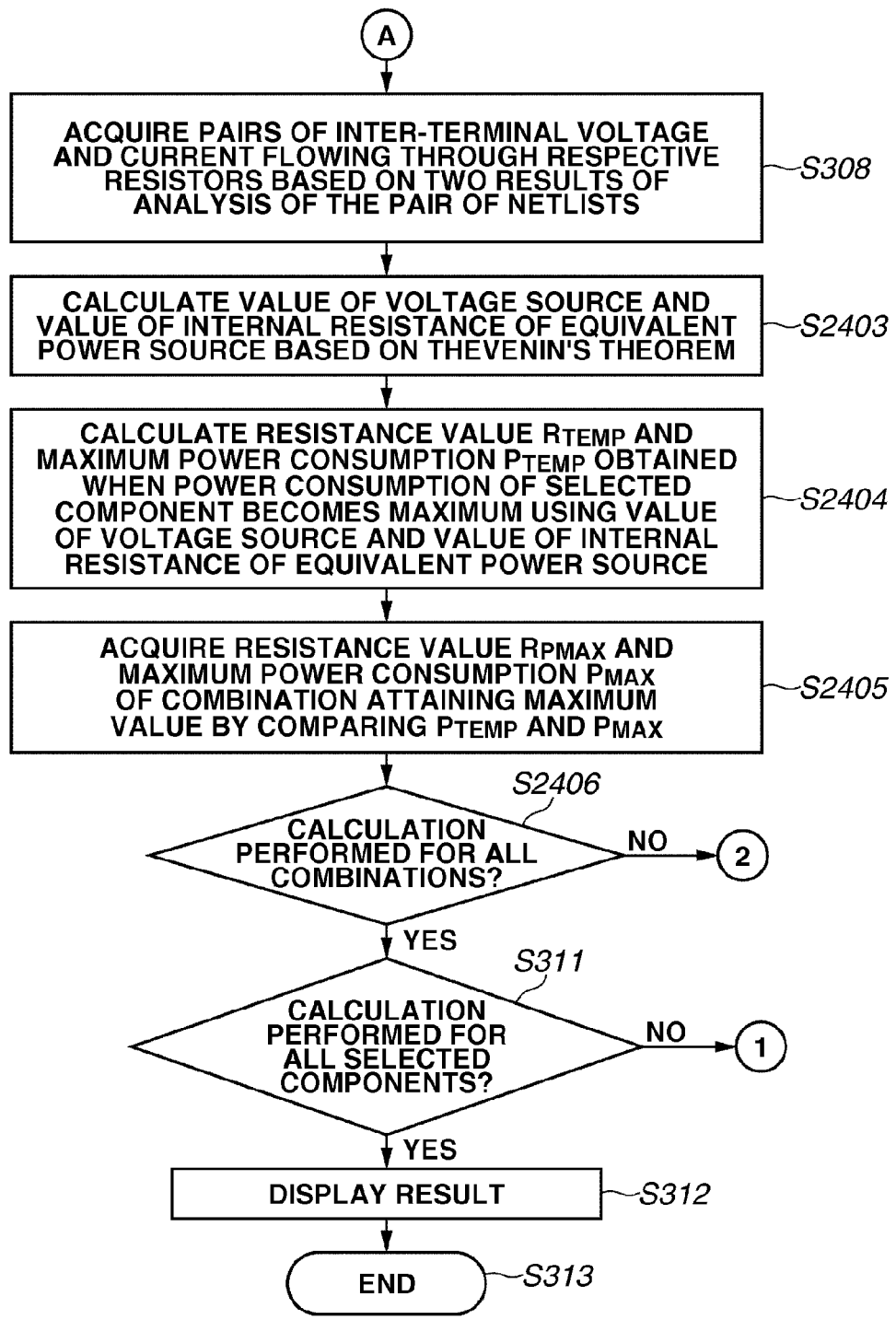
FIG. 16 illustrates a part of the flowchart of the circuit simulation according to the third exemplary embodiment.

FIGS. 15 and 16 are flowcharts illustrating an example of a processing procedure in a circuit simulation according to the third exemplary embodiment. The operations of the circuit simulation program according to the present exemplary embodiment will be described below in more detail using the flowcharts of FIGS. 15 and 16, and the figures from FIG. 17 to FIGS. 19A and 19B. To make the figures easier to view, in the present exemplary embodiment, similar components are denoted with the same reference numerals even in different figures.

First, the flowcharts illustrated in FIGS. 15 and 16 will be described. In FIGS. 15 and 16, all the steps which are denoted with the same reference numerals as in FIG. 3 are performing similar processing to that described in the first exemplary embodiment, and thus a description thereof will be omitted here. Specifically, here, the processing performed in steps S2400, S2401, S2402, S2403, S2404, S2405, and S2406 will be described in detail.

In step S2400, for a component having three or more terminals, when calculating the maximum power consumption obtained when a half short-circuit occurs of that component and the resistance value at that point, combinations selecting two terminals from among all of the terminals possessed by the component are generated. The processing program 12a reads the wiring connection information and a component number of a component to be half short-circuited stored in the main storage device 11, and acquires the terminal information from the main storage device 11. Further, based on the acquired terminal information, the processing program 12a generates combinations in which two terminals are selected, and stores those combinations in the main storage device 11. This terminal information is, for example, in the wiring connection information illustrated in FIG. 8, information indicating that the component of resistor R114 has two terminals, and that the respective terminals are connected to the nets N113 and N114.

In step S2401, areas for storing the component maximum power consumption $P_{MAX}$ and the resistance value $R_{PMAX}$ are prepared in the main storage device 11. In each of these areas, 0 is stored as the initial value.

Next, in step S2402, from one pair among the combinations, two terminals are acquired, and netlists in which two different resistances are inserted in between the two terminals are generated. The processing program 12a reads one of the combinations of two terminals from the main storage device 11, and generates netlists in which two different resistances are inserted in between the two terminals. The two generated netlists are stored in the main storage device 11. Further, analysis information is generated based on the generated netlists and the analysis condition set in step S304. The generated analysis information is stored in the external storage device 12. Similar processing is also performed when the processing returns from step S2406.

In step S2403, Thevenin's theorem is applied to between the two terminals, and the voltage value of the voltage source of the equivalent power source and the resistance value of the internal resistance are calculated. The processing program 12a reads the values of the inter-terminal voltage and the current stored in the main storage device 11 in step S308, and calculates the voltage value of the voltage source and the resistance value of the internal resistance. The voltage value of the voltage source and the resistance value of the internal resistance are stored in the main storage device 11. Next, in step S2404, the resistance value obtained when the power consumption of the component becomes a maximum, and the power consumption at that point, are calculated. The processing program 12a reads the voltage value of the voltage source of the equivalent power source and the resistance value of the internal resistance stored in the main storage device 11 in step S2403, and calculates the maximum power consumption $P_{TEMP}$ and the resistance value $R_{TEMP}$.

In step S2405, the maximum power consumption $P_{TEMP}$ and the maximum power consumption $P_{MAX}$ are compared. The processing program 12a reads the maximum power consumption $P_{TEMP}$ and the maximum power consumption $P_{MAX}$ from the main storage device 11, and compares the read values based on control by the CPU 10. If $P_{TEMP}$ is greater than $P_{MAX}$, the values of $P_{MAX}$ and $R_{MAX}$ stored in the main storage device 11 are rewritten with $P_{TEMP}$ and $R_{TEMP}$.

In step S2406, the steps from step S2402 to S2405 are executed for all the combinations generated in step S2400. The processing program 12a returns the processing to step S2402 if there is a two-terminal combination which has not yet been processed in the main storage device 11 (NO in step S2406). When all of the combinations have been processed (YES in step S2406), the processing proceeds to step S311.

The above is a detailed description of an example of the flowchart of the circuit simulation program according to the present exemplary embodiment. Next, the operations of the circuit simulation program will now be described in more detail. The operations of the circuit simulation program according to the present exemplary embodiment will be described in detail using FIGS. 17 to 19A and 19B. First, the electric circuit diagram and the schematic diagram illustrating the wiring connection information thereof illustrated in FIGS. 17 and 18 will be described.

Figure 17:
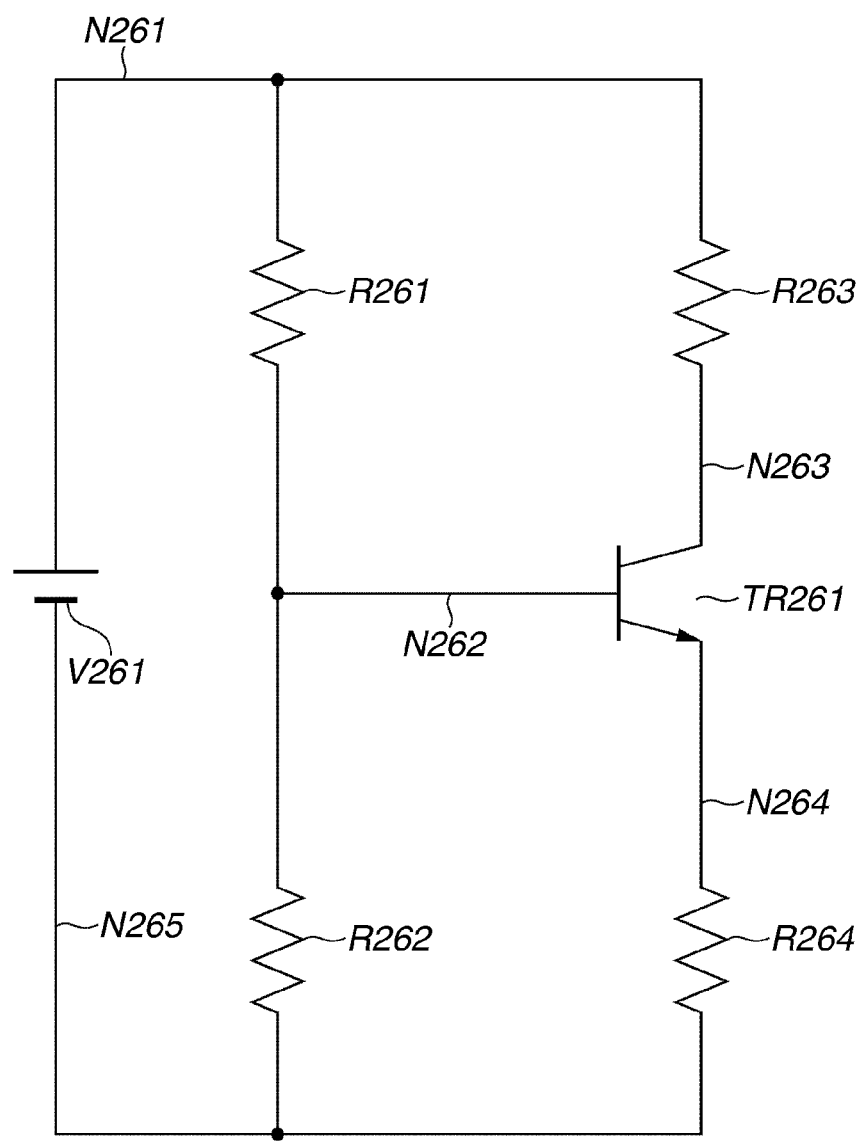
FIG. 17 is a schematic diagram illustrating an electric circuit according to the third exemplary embodiment.

FIG. 17 illustrates an electric circuit diagram. The circuit illustrated in FIG. 17 includes resistors R261, R262, R263, and R264, a transistor TR261, a voltage source V261, and net node numbers N261, N262, N263, N264, and N265. The resistors are all 100 (Ω), and the voltage source has a voltage value of 100 (V). FIG. 18 illustrates wiring connection information about the electric circuit diagram illustrated in FIG. 17. Described in the wiring connection information is information about the constituent components of the electric circuit and the parameter information thereof, and inter-component wiring connection information.

The operations of the circuit simulation program according to the present exemplary embodiment will now be described in more detail. In this description, the component selected in step S302 is the transistor TR261. The resistance value set in step S303 is the same as in the first exemplary embodiment. Further, in the present exemplary embodiment, the equivalent power source illustrated in FIG. 5A is generated, and calculation is performed using equations (3) to (8).

In step S2400, combinations obtained by selecting two terminals from among the terminals possessed by the component are generated. The transistor TR261 has three terminals, which are respectively connected to nodes N262, N263, and N264. For convenience, these terminals will be respectively described as terminals B, C, and E. In step S2400, three combination pairs are generated, a pair of terminals B and C, a pair of terminals B and E, and a pair of terminals C and E.

In step S2401, areas for temporarily storing the maximum power consumption and the resistance value calculated for each combination of terminals are prepared in the main storage device 11.

In step S2402, a netlist is generated in which two different resistances are inserted in between the two terminals. An example of the generated netlist is illustrated in FIGS. 19A and 19B. FIG. 19A is an example in which the connection between terminals B and C of transistor TR261 is replaced with the resistor R281 having a resistance value of 1Ω. FIG. 19B is an example in which the connection between terminals B and C of transistor TR261 is replaced with the resistor R282 having a resistance value of 100 kΩ. At this stage, one end of the node N264, which was connected to terminal E, becomes unconnected. In step S2402, when the processing returns from step S2406, a netlist is similarly generated for the pair of terminals B and E and the pair of terminals C and E as well. Consequently, six netlists are generated.

In step S2403, the voltage value of the voltage source V81 of the equivalent power source E81 and the resistance value of the internal resistance R81 illustrated in FIG. 5A are calculated. Based on analysis performed by replacing the selected component with different resistances, the voltage value of the voltage source V81 is 50.0 (V) and the resistance value of the internal resistance R81 is 150 (Ω).

In step S2404, the maximum power consumption of the resistor $R_x$ connected to the equivalent power source E81 and the resistance value at that point are calculated to be a maximum power consumption of 4.16 (W) and a resistance value of 150 (Ω).

In step S2405, the value of $P_{TEMP}$ obtained by replacing the selected component with different resistance values and the value of $P_{MAX}$ are compared. Since $P_{MAX}=0$ at this stage, $P_{TEMP}$ is greater than $P_{MAX}$. Therefore, the values of $P_{MAX}$ and $R_{PMAX}$ are replaced with the values of $P_{TEMP}$ and $R_{TEMP}$, which are then stored. In step S2406, since the calculations for the pair of terminals B and E and the pair of terminals C and E are not finished (NO in step S2406), the processing returns to step S2402. Then, in step S2402, a netlist is generated for the next pair of terminals (in the following, the pair of terminals B and E). In step S306, the netlist generated in step S2402 is analyzed. In step S2403, the voltage value of the voltage source V81 of the equivalent power source E81 and the resistance value of the internal resistance R81 are calculated to be a voltage value of the voltage source V81 of 50.0 (V) and a resistance value of the internal resistance R81 of 150 (Ω). In step S2404, the maximum power consumption of the resistor $R_x$ connected to the equivalent power source E81 and the resistance value at that point are calculated to be a maximum power consumption of 4.16 (W) and a resistance value of 150 (Ω). In step S2405, the value of $P_{MAX}$ and the calculated value of $P_{TEMP}$ are compared. Since $P_{MAX}=4.16$ at this stage, $P_{TEMP}$ equals $P_{MAX}$. Therefore, the values of $P_{MAX}$ and $R_{PMAX}$ are left as is.

In step S2406, since the calculations for the pair of terminals C and E are not finished (NO in step S2406), the processing returns to step S2402. Then, in step S2402, a netlist is generated for the next pair of terminals (the pair of terminals C and E). In step S306, the netlists generated in step S2402 is analyzed. In step S2403, the voltage value of the voltage source V81 of the equivalent power source E81 and the resistance value of the internal resistance R81 are calculated to be a voltage value of the voltage source V81 of 100 (V) and a resistance value of the internal resistance R81 of 200 (Ω). In step S2404, the maximum power consumption of the resistor $R_x$ connected to the equivalent power source E81 and the resistance value at that point are calculated to be a maximum power consumption of 12.5 (W) and a resistance value of 200 (Ω). In step S2405, the value of $P_{MAX}$ and the calculated value of $P_{TEMP}$ are compared. Since at this stage $P_{MAX}=4.16$ and $P_{TEMP}=12.5$, $P_{TEMP}$ is greater than $P_{MAX}$. Therefore, the value of $P_{MAX}$ is rewritten. Consequently, $P_{MAX}=12.5$ and $R_{TEMP}=200$. In step S2406, there are no remaining terminal pairs (YES in step S2406), and thus the processing proceeds to step S311. In the present exemplary embodiment, since the component to be half short-circuited is only the transistor TR261, the processing proceeds to step S312. In step S312, the output of results are a maximum power consumption between the two terminals in the transistor TR261 of 12.5 (W), and a resistance value at that stage of 200 (Ω).

When the output of results is finished, then in step S313, the program ends.

The above is a description of the operations of a circuit simulation program according to the third exemplary embodiment. Based on the results displayed on the screen illustrated in FIG. 6, the user determines whether the transistor TR261 is a component which can withstand the maximum power consumption when a half short-circuit occurs. Based on that determination, if it is determined that the transistor TR261 is a component which cannot withstand a half short-circuit, for example, the user can take a measure such as changing the transistor TR261 component to a component having a greater rated power consumption. The user could also take a measure such as modifying the electric circuit so that the power consumption does not increases even when the transistor TR261 half short-circuits.

Similar to the first exemplary embodiment, the third exemplary embodiment also includes display methods other than a display on a screen using the display device 14. Further, equations other than the equations used in the present exemplary embodiment may also be used. In addition, similar analysis can be performed in the present exemplary embodiment even using wiring connection information for a state in which a single component or a plurality of components have short-circuited or open-circuited.

Moreover, analysis performed by generating wiring connection information in which the component has been open-circuited or short-circuited is also included in the third exemplary embodiment. For example, such analysis can be performed by omitting step S303 illustrated in FIG. 15, and changing step S2402 to a step for generating a pair of netlists in which the selected two terminals have been short-circuited or open-circuited.

Further, in the third exemplary embodiment also, the calculation can be performed by applying Norton's theorem. For example, the flowcharts illustrated in FIGS. 15 and 16 may be changed as follows. Step S2403 can be replaced with a step for calculating a current value of a current source of an equivalent power source and a resistance value of an internal resistance thereof, and step S2404 replaced with a step for calculating the resistance value of $R_{TEMP}$ and the maximum power consumption of $P_{TEMP}$ obtained when the power consumption of a selected component becomes a maximum, using the current value of the current source of the equivalent power source and the resistance value of the internal resistance. This allows calculation to be performed by applying Norton's theorem.

Based on the above-described exemplary embodiments, when a component half short-circuits, the resistance obtained when the power consumption of that component becomes a maximum and the power consumption at that point can be clearly indicated. Further, the maximum power consumption obtained when the half short-circuit occurs can be calculated by generating netlist in which a component has been short-circuited or open-circuited. In addition, calculating the maximum power consumption when a half short-circuit occurs and the resistance value at that point based on wiring connection information in which another component is short-circuited or open-circuited can be performed. Consequently, the maximum power consumption of a half short-circuited component can be calculated even when components fail in a chain-reaction manner. Consequently, the resistance obtained when the power consumption of the half short-circuited component becomes a maximum and the power consumption at that point can be clearly indicated even when components fail in a chain-reaction manner.

Aspects of the present invention can also be realized by a computer of a system or apparatus (or devices such as a CPU, an MPU (micro-processing unit), and/or the like) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2009-149068 filed Jun. 23, 2009, which is hereby incorporated by reference herein in its entirety.

What is claimed is:

1. An alternating current circuit simulation apparatus including a processor, the apparatus comprising:
    an acquisition unit configured to acquire wiring connection information indicating connection data in an electric circuit, the wiring connection information being stored in an external storage device based on a control command from the processor;
    a component selection unit configured to select a component constituting the circuit based on the wiring connection information;
    a setting unit configured to replace the selected component with each resistor having different resistance values;
    a netlist generation unit configured to generate at least one of netlists using the processor, the acquired wiring connection information and at least one of the set resistance values;
    a first calculation unit configured to calculate a value of an equivalent direct current power source and a value of an internal resistance thereof for a part of the circuit replaced with an equivalent direct current circuit using the acquired wiring connection information and at least one of the generated netlists; and
    a second calculation unit configured to calculate a resistance value of the selected component and a power consumption for the resistance value using the value of the equivalent direct current power source and the value of the internal resistance.

2. The circuit simulation apparatus according to claim 1, further comprising:
    an analysis condition setting unit configured to set an analysis condition for circuit simulation; and
    an analysis unit configured to analyze the circuit using the generated netlist and the analysis condition,
    wherein the first calculation unit is configured to calculate the value of the equivalent power source and the value of the internal resistance using a plurality of pairs of an inter-terminal potential difference between terminals of the replaced resistor and a current flowing through the resistor, which are obtained based on analysis results from the analysis unit.

3. The circuit simulation apparatus according to claim 1, wherein the value of the equivalent power source is a value of a voltage source based on Thevenin's theorem, and
    wherein the first calculation unit is configured to calculate the value of the voltage source of the equivalent power source and the value of the internal resistance thereof for a plurality of netlists generated by the netlist generation unit.

4. The circuit simulation apparatus according to claim 1, wherein the value of the equivalent power source is a value of a current source based on Norton's theorem, and
    wherein the first calculation unit is configured to calculate the value of the current source of the equivalent power source and the value of the internal resistance thereof for a plurality of netlists generated by the netlist generation unit.

5. The circuit simulation apparatus according to claim 1, wherein the second calculation unit is configured to calculate the resistance value when power consumption of the selected component becomes a maximum and a maximum power consumption for the resistance value.

6. The circuit simulation apparatus according to claim 1, wherein the different resistance values include a resistance value of an open state of the selected component and a resistance value of a short circuit state of the selected component.

7. The circuit simulation apparatus according to claim 1, wherein the generated netlist includes wiring connection information in which one or a plurality of components other than the selected component are in an open state or a short circuit state.

8. A circuit simulation method comprising:
    acquiring wiring connection information indicating connection data in an electric circuit, the wiring connection information being stored in an external storage device based on a control command from a processor;
    selecting a component constituting the circuit based on the wiring connection information;
    replacing the selected component with each resistor having different resistance values;
    generating at least one of netlists using the processor, the acquired wiring connection information and at least one of the set resistance values;
    calculating a value of an equivalent power source and a value of an internal resistance thereof for a part of the circuit replaced with an equivalent direct current circuit using the acquired wiring connection information and at least one of the generated netlists; and calculating a resistance value of the selected component and a power consumption for the resistance value using the value of the equivalent power source and the value of the internal resistance.

9. A non-transitory computer-readable storage medium storing a computer-readable program which, when executed by a computer, causes the computer to perform operations comprising:

acquiring wiring connection information indicating connection data in an electric circuit, the wiring connection information being stored in an external storage device based on a control command;

selecting a component constituting the circuit based on the wiring connection information;

replacing the selected component with each resistor having different resistance values;

generating at least one of netlists using the acquired wiring connection information and at least one of the set resistance values;

calculating a value of an equivalent direct current power source and a value of an internal resistance thereof for a part of the circuit replaced with an equivalent direct current circuit using the acquired wiring connection information and at least one of the generated netlists; and calculating a resistance value of the selected component and a power consumption for the resistance value using the value of the equivalent direct current power source and the value of the internal resistance.

* * * * *